US012733480B2

(12) United States Patent
Becker et al.

(10) Patent No.: US 12,733,480 B2
(45) Date of Patent: Sep. 8, 2026

(54) DEVICE FOR DETECTING AN ELECTROMAGNETIC RADIATION INCLUDING A THERMAL DETECTOR OVER A READOUT SUBSTRATE AN ACTIVE ELECTRONIC ELEMENT OF WHICH IS LOCATED THE CLOSEST TO THE THERMAL DETECTOR

(71) Applicant: COMMISSARIAT A L'ENERGIE ATOMIQUE ET AUX ENERGIES ALTERNATIVES, Paris (FR)

(72) Inventors: Sébastien Becker, Grenoble Cedex (FR); Patrick Leduc, Grenoble Cedex (FR); Thomas Perrillat-Bottonet, Grenoble Cedex (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 330 days.

(21) Appl. No.: 18/545,750

(22) Filed: Dec. 19, 2023

(65) Prior Publication Data

US 2024/0213148 A1 Jun. 27, 2024

(30) Foreign Application Priority Data

Dec. 21, 2022 (FR) ...................................... 22 14113

(51) Int. Cl.
*H10W 20/42* (2026.01)
*H10D 86/00* (2025.01)
(Continued)

(52) U.S. Cl.
CPC ............ *H10W 20/42* (2026.01); *H10D 86/00* (2025.01); *H10D 86/01* (2025.01); *H10W 90/00* (2026.01);
(Continued)

(58) Field of Classification Search
CPC ... H10W 20/42; H10W 90/00; H10W 90/792; H10W 72/952; H10D 86/00;
(Continued)

(56) References Cited

U.S. PATENT DOCUMENTS

| | | | |
|---|---|---|---|
| 2021/0199509 | A1 | 7/2021 | Aliane et al. |
| 2021/0347636 | A1 | 11/2021 | Becker et al. |
| 2021/0389186 | A1 | 12/2021 | Cortial |

FOREIGN PATENT DOCUMENTS

| | | | |
|---|---|---|---|
| FR | 2 999 338 | A1 | 6/2014 |
| FR | 3 089 685 | A1 | 6/2020 |

(Continued)

OTHER PUBLICATIONS

French Preliminary Search Report Issued Jun. 19, 2023 in French Application 22 14113 filed on Dec. 21, 2022 (with English Translation of Categories of Cited Documents & Written Opinion), 10 pages.

*Primary Examiner* — Calvin Y Choi
(74) *Attorney, Agent, or Firm* — Oblon, McClelland, Maier & Neustadt, L.L.P.

(57) ABSTRACT

The invention relates to a device for detecting an electromagnetic radiation, comprising at least one sensitive pixel including a thermal detector (10), and including a readout substrate (20) formed of a stack of a readout structure (23) and an interconnection structure (22). The thermal detector includes a suspended absorbing membrane (11), and anchor pillars (13). The readout structure (23) is located over and in contact with the interconnection structure (22); the first active electronic element (**23.1*a*) is directly connected to the upper metallization level; and the anchor pillars (13) continuously extend in the readout substrate (20**) until coming into contact with the upper metallization level.

13 Claims, 11 Drawing Sheets

(51) Int. Cl.
*H10D 86/01* (2026.01)
*H10W 72/90* (2026.01)
*H10W 90/00* (2026.01)

(52) U.S. Cl.
CPC ........ *H10W 72/952* (2026.01); *H10W 90/792* (2026.01)

(58) Field of Classification Search
CPC .......... H10D 86/01; G01J 5/023; G01J 5/024; G01J 5/10; G01J 5/20
See application file for complete search history.

(56) References Cited

FOREIGN PATENT DOCUMENTS

| | | | |
|---|---|---|---|
| WO | WO 2019/229353 | A1 | 12/2019 |
| WO | WO 2020/074838 | A1 | 4/2020 |

DEVICE FOR DETECTING AN ELECTROMAGNETIC RADIATION INCLUDING A THERMAL DETECTOR OVER A READOUT SUBSTRATE AN ACTIVE ELECTRONIC ELEMENT OF WHICH IS LOCATED THE CLOSEST TO THE THERMAL DETECTOR

TECHNICAL FIELD

The field of the invention is that of devices for detecting an electromagnetic radiation, including at least one thermal detector with an absorbing membrane suspended above a readout substrate and thermally insulated from the latter. In particular, the invention applies to the field of infrared or terahertz imaging, thermography, or gas detection.

PRIOR ART

An electromagnetic radiation detection device may include sensitive pixels each formed of a thermal detector including an absorbing membrane suspended and thermally insulated from a readout substrate. The absorbing membrane includes an absorber of the electromagnetic radiation to be detected, associated with a thermometric transducer the intensity of whose electrical property varies according to heat-up of the transducer. Such a thermometric transducer may be a thermistor (for example, a vanadium or titanium oxide, or amorphous silicon), a diode (pn or pin junction), or a metal-oxide-semiconductor field-effect transistor (MOSFET).

The temperature of the thermometric transducer being dependent on its environment, the absorbing membrane is thermally insulated from the readout substrate. For this purpose, the absorbing membrane is generally suspended above the readout substrate through anchor pillars, and is thermally insulated from these by thermal insulation arms. These anchor pillars and thermal insulation arms also have an electrical function by ensuring electrical connection of the absorbing membrane to the readout circuit.

According to a so-called 'above IC' configuration (i.e. above the integrated circuit), described in particular in the document EP2743659A1, the thermal detectors are made above the readout circuit located in the support substrate. The readout circuit is in the form of a CMOS integrated circuit, and includes an interconnection structure located above a readout structure.

The interconnection structure, or the BEOL structure (Back End Of Line), is formed of superficial layers where metallization levels are defined, which are vertically separated by inter-metal dielectric layers (IMD), and are connected together through conductive vias.

The readout structure, or FEOL structure (Front End Of Line), is formed of semiconductor-based deep layers where active electronic elements (diodes, transistors, etc.) and possibly passive electronic elements (capacitors, resistors, etc.) are made. The electronic elements are connected through the metallization levels to the thermal detectors on the one hand, and to at least one outer connection pad on the other hand, the latter being intended to connect the detection device to an outer electronic device.

As described in particular in the document EP2894445A1, each sensitive pixel may include an active electronic element such as an injection MOS transistor, connected to the corresponding thermal detector, through the metallization levels of the interconnection structure. The readout circuit of each sensitive pixel may be connected to that of one or more compensation thermal detector(s) located for example at the column root of the detection array, and to a capacitive transimpedance amplifier (CTIA).

However, there is a need to improve the performances of such a detection device.

DISCLOSURE OF THE INVENTION

An objective of the invention is to overcome at least part of the drawbacks of the prior art, and more particularly to provide a detection device that has improved electrical performances, in particular in terms of pulse response (limitation of the parasitic capacitance at the readout node of the sensitive element of the pixel), and possibly in terms of access resistance. The detection device includes at least one thermal detector with a membrane suspended above a readout substrate. The original structural configuration of the readout substrate allows not only improving these electrical performances of the detection device, but also leads to a better mechanical hold of the anchor pillars.

For this purpose, an object of the invention is a device for detecting an electromagnetic radiation, comprising at least one sensitive pixel including a thermal detector, and including a readout substrate, including a readout circuit, which is formed of a stack of: a readout structure containing active electronic elements of the readout circuit, including at least one first active electronic element located in the sensitive pixel and connected to the thermal detector; and an interconnection structure containing different metallization levels connected to the active electronic elements, including an upper metallization level located on the side of an upper face of the readout substrate.

The thermal detector includes: an absorbing membrane, suspended above an upper face of the readout substrate and thermally insulated from the latter; and anchor pillars, ensuring suspension of the absorbing membrane and the electrical connection of the latter to the readout circuit.

According to the invention, the readout structure is located over and in contact with the interconnection structure; the first active electronic element is directly connected to the upper metallization level; and the anchor pillars continuously extend in the readout substrate until coming into contact with the upper metallization level.

Some preferred yet non-limiting aspects of this detection device are as follows.

The upper metallization level may include several coplanar conductive portions, including a first conductive portion with which a first anchor pillar of the sensitive pixel comes into contact, and to which the first active electronic element is connected by means of a first conductive via.

The active electronic elements may be directly connected to coplanar conductive portions of the upper metallization level through conductive vias, said conductive vias and the anchor pillars being made of the same materials.

The readout substrate may include an upper structure located over and in contact with the readout structure. The readout structure may include: a first insulating layer in which the active electronic elements are located and throughout which conductive vias extend between the active electronic elements and conductive portions of the upper metallization level; and a second insulating layer which extends over and in contact with the insulating layer and the active electronic elements. In addition, the upper structure may include: a third insulating layer, which extends over and in contact with the second insulating layer; and a reflector resting on the third insulating layer.

The upper structure may include a protective thin layer, made of a material inert to hydrofluoric acid, extending over the third insulating layer, the first, second and third insulating layers being made of a mineral material.

The reflector may be a Bragg mirror formed of several thin layers spaced vertically apart from one another and held by conductive vias crossing said thin layers.

The readout substrate may be a first readout substrate to which a second readout substrate is assembled and electrically connected at the level of a face opposite to the upper face of the first readout substrate, the second readout substrate including a stack of a second readout structure and of a second interconnection structure, wherein: conductive portions of a lower metallization level of the second interconnection structure are connected to active electronic elements of the second readout structure; and conductive portions of an upper metallization level of the second interconnection structure are in contact with conductive portions of a lower metallization level of the interconnection structure of the first readout substrate.

The detection device may include an outer connection pad intended to be electrically connected to an outer electronic system, extending throughout the readout structure so as to come into contact with at least one conductive portion of the upper metallization level.

The invention also covers a method for manufacturing a detection device according to any one of the preceding features, including the following steps:

- making a first stack including a handle on which a sacrificial layer made of a mineral material rests;
- transferring and molecular bonding, onto the first stack, of a SOI substrate formed of a silicon substrate, an oxide layer then a silicon thin layer, then removal of the silicon substrate;
- making the readout structure, the active electronic elements being made starting from the silicon thin layer over the SOI substrate,
- making the interconnection structure over the readout structure, conductive portions of the upper metallization level being directly connected to the active electronic elements through conductive vias;
- turning obtained stack over, then removing the handle;
- making the absorbing membrane over the sacrificial layer;
- eliminating the sacrificial layer so as to suspend the absorbing membrane.

The making of the readout structure may include the following steps:

- depositing a first insulating layer covering the active electronic elements;
- making conductive vias, extending throughout the first insulating layer so as to come into contact with the active electronic elements;
- making the anchor pillars, extending throughout the first insulating layer and the sacrificial layer so as to come into contact with the handle.

The method may include, before the transferring and molecular bonding step, a step of making an upper structure, resting on the sacrificial layer, including a reflector and a protective thin layer, which are covered with a third insulating layer.

The silicon thin layer of the SOI substrate may be covered with a second insulating layer, so that, during transferring and molecular bonding, the second insulating layer is brought into contact with the third insulating layer.

During the step of making the absorbing membrane, a thermometric transducer, for example a thermistor, may be made.

Alternatively, during the step of making the first stack, a thermometric transducer, for example a junction diode or a transistor, may be made over the handle, then be covered with the sacrificial layer.

BRIEF DESCRIPTION OF THE DRAWINGS

Other aspects, aims, advantages and features of the invention will appear better upon readout the following detailed description of preferred embodiments thereof, given as a non-limiting example, and made with reference to the appended drawings wherein.

DETAILED DISCLOSURE OF PARTICULAR EMBODIMENTS

Figure 1A:
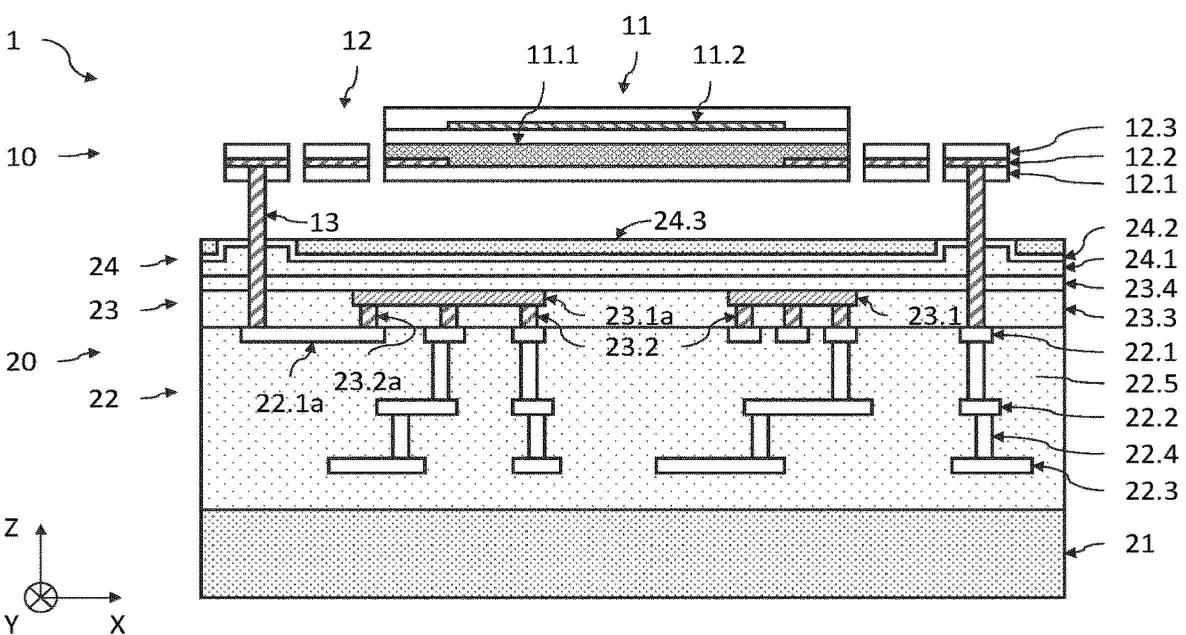
FIG. 1A is a schematic and partial cross-sectional view of a detection device according to one embodiment where the readout substrate includes a readout structure located over the interconnection structure.

In the figures and in the following description, same references represent identical or similar elements. In addition, the different elements are not plotted to scale so as to favor clarity of the figure. Moreover, the different embodiments and variants are not exclusive of one another and could be combined together. Unless stated otherwise, the terms “substantially”, “about”, “in the range of” mean within a 10% margin, and preferably within a 5% margin. Moreover, the terms “comprised between . . . and . . . ” and the like mean that the bounds are not included, unless stated otherwise.

The invention covers a device for detecting an electromagnetic radiation, for example an infrared or terahertz radiation. Thus, the detection device may be particularly adapted to detect an infrared radiation of the LWIR range (Long Wavelength Infrared) whose wavelength is comprised between about 8 μm and 14 μm.

The detection device includes at least one sensitive pixel, and preferably an array of sensitive pixels. A sensitive pixel is formed of a thermal detector, intended to absorb the electromagnetic radiation, and electrically connected to a readout circuit located in the substrate on which it rests.

The thermal detector is of the type with an absorbing membrane, which is suspended to the readout substrate by thermal insulation arms 12 and anchor pillars. The pillars and the arms ensure the electrical connection of the absorbing membrane to the readout circuit. The absorbing membrane includes a detection thermometric transducer, i.e. an element having an electrical property varying with heating thereof. Such a transducer may be a thermistor based on vanadium or titanium oxide, or of amorphous silicon. It may also consist of a pn or pin junction diode, or be a MOS field-effect transistor (MOSFET).

The readout substrate is formed of a stack of an interconnection structure (of the BEOL type) and of a readout structure (of the FEOL type). Each sensitive pixel includes at least one active electronic element of the readout structure (for example a MOS transistor), connected to the thermal detector by the upper metallization level of the interconnection structure. Moreover, the interconnection structure ensuring the electrical connection of the sensitive pixels to other active electronic elements of the readout circuit, as well as to an outer connection pad.

Each of the interconnection levels is formed of coplanar conductive portions, these being connected to those of the adjacent interconnection levels through conductive vias. Hence, the interconnection structure includes several interconnection levels parallel and arranged vertically with respect to one another. Thus, it includes a so-called upper first interconnection level, located on the side of the thermal detector, intermediate interconnection levels, and a so-called lower last interconnection level, located on the side opposite to the thermal detector.

According to the invention, in the readout substrate, the readout structure is located over the interconnection structure, i.e. above the latter. In other words, it is located on the side of the thermal detector while the interconnection structure is located on the opposite side. This configuration is the inverse of the usual configuration of the detection devices of the prior art, where the FEOL-type readout structure is located beneath the BEOL-type interconnection structure.

In addition, a first active electronic element of the sensitive pixel (for example the MOS transistor) is directly connected to the upper metallization level, i.e. without passing through intermediate metallization levels. This configuration is also the inverse of what is usually practiced in the prior art where the injection MOS transistor is generally connected to the lower metallization level.

Finally, the anchor pillars continuously extend into the readout substrate until coming into contact with the upper metallization level. By "continuously extend", it should be understood that the anchor pillars extend with no discontinuity in the materials which form them up to the upper metallization level. Hence, the anchor pillars have a lower portion which is located inside the readout substrate, which allows improving their mechanical strength.

Also, in the same sensitive pixel, the anchor pillars and the first active electronic element are in contact with the upper metallization line. This structural configuration allows improving the electrical performances of the detection device, to the extent that the access resistance and the parasitic capacitances are reduced, while enhancing the mechanical strength of the anchor pillars.

FIG. 1A is a schematic and partial cross-sectional view of a detection device 1 according to one embodiment. In this example, the transducer 11.1 is a thermistor.

An orthogonal three-dimensional direct reference frame XYZ is herein defined for the next description, where the plane XY is substantially parallel to the main plane of the readout substrate 20, and where the Z axis is directed in the direction of the absorbing membrane 11. In the next description, the terms "lower" and "upper" should be understood as relating to an increasing positioning when getting away from the readout substrate 20 according to the direction +Z.

The readout substrate 20 herein includes a stack formed of a support substrate 21, an interconnection structure 22 (BEOL), a readout structure 23 (FEOL), and finally in this case an upper structure 24 which includes a reflector 24.3.

The support substrate 21 is an optional substrate over which the interconnection structure 22 rests and is in contact. It consists of a handle which has been used during the manufacturing process (cf. FIG. 2A to 2H). It herein consists of a thick substrate made of a silicon for example of several hundred microns.

The interconnection structure 22 is a portion of the readout substrate 20 which includes a plurality of metallization levels parallel to one another. Each metallization level includes coplanar conductive portions, connected to the conductive portions of the adjacent metallization levels through conductive vias 22.4. The conductive vias 22.4 cross insulating layers 22.5 so-called inter-metal dielectric (IMD), which separate the metallization levels in pairs. The interconnection structure 22 ensures electrical connection, for each sensitive pixel, between the absorbing membrane 11 and the active electronic element(s) 23.1 associated with the considered absorbing membrane 11. It also ensures electrical connection of each sensitive pixel to any other readout system adapted to read the electrical information output by the detection device, and possibly to other active electronic elements, for example to a capacitive transimpedance amplifier (CTIA) located at the column root (in the case where the transducer is a thermistor), this CTIA being also connected to one or more compensation thermal detectors. Finally, it ensures electrical connection to an outer connection pad 2 (cf. FIG. 2H).

Hence, the metallization levels include, according to the direction −Z, a first metallization level, or an upper metallization level, formed of the conductive portions 22.1, and located on the side of the upper face of the readout substrate 20, and a last metallization level, or lower metallization level, formed of the conductive portions 22.3, and located on the side of the lower face of the readout substrate 20. Intermediate metallization levels (conductive portions 22.2) are present between the upper and lower levels. It should then be understood that there are no metallization levels of the interconnection structure 22 located above the upper level, i.e. located between the upper face and the upper metallization level. The conductive portions 22.1, 22.2 and 22.3 and the conductive vias 22.4 may be made, for example, based on copper, aluminum, or tungsten, inter alia. The insulating layers 22.5 are made of a mineral material, for example, based on a silicon oxide or nitride.

The readout structure 23 is a portion of the readout substrate 20 which includes the active or passive electronic elements which are connected to the sensitive pixels, and possibly to one or more compensation pixel(s). The active electronic elements 23.1 may be of the transistor, diode (for example photodiode, light-emitting diode, etc.) type, and the passive electronic elements may consist of capacitors, resistors, etc. The readout structure 23 is located above the interconnection structure 22 according to the vertical axis Z, i.e. it is located between the upper face of the readout substrate 20 and the interconnection structure 22.

For each sensitive pixel, the active electronic elements 23.1 are connected to the upper metallization level, and more specifically to the conductive portions 22.1 via conductive vias 23.2. The active electronic elements 23.1 are herein located beneath the absorbing membrane 11 in the plane XY, and above the upper metallization level. The active electronic elements 23.1 are herein directly connected to the conductive portions 22.1 through the conductive vias 23.2, i.e. each conductive via 23.2 is in contact with an active electronic element 23.1 and a conductive portion 22.1. One or more via(s) 23.2 may also be connected to one or more passive electronic element(s). Unless stated otherwise, when reference is made to two elements that are directly connected to one another, it should be understood that they are connected through a conductive via, without passing through an intermediate metallization level.

Other active electronic elements 23.1 are located at the root of the column, in particular to define the aforementioned CTIA. Hence, they are offset in the plane XY with respect to the sensitive pixels. They are also located between the upper face and the interconnection structure 22.

According to one embodiment, in each sensitive pixel, a first active electronic element 23.1*a* is directly connected to a first conductive portion 22.1*a* of the upper metallization level by at least one first conductive via 23.2*a*. As described later on, this conductive portion 22.1*a* is also in contact with one of the anchor pillars 13. This configuration allows reducing the access resistance between the active electronic element 23.1*a*, for example in this case the injection MOS transistor, and the absorbing membrane 11, and also reducing the parasitic capacitances.

The conductive vias 23.2 of the active electronic elements 23.1, directly connecting these to the upper metallization level, may be made of the same material(s) as that/those of the anchor pillars 13. For example, the conductive vias 23.2 may be formed of an envelope, for example made of Ti/TiN or Ta/TaN, as described in particular in the aforementioned document EP2743659) which surrounds a copper Cu and/or tungsten W core. The active electronic elements 23.1 are made starting from a semiconductor layer 43 (cf. FIG. 2C to 2E), made for example based on silicon, and are surrounded by one or more insulating layer(s) 23.3 and 23.4 made of a dielectric material. In this example, the active electronic elements 23.1 are located in an insulating layer 23.3 and are covered with an insulating layer 23.4. This insulating layer 23.4 is made of an oxide, and is bonded by oxide/oxide molecular bonding with an insulating layer 24.1 also made of an oxide. This transferring and molecular bonding step is described later on with reference to FIG. 2D.

The upper structure 24 herein includes the insulating layer 24.1, a protective thin layer 24.2 and a reflector 24.3. The protective thin layer 24.2 herein extends over and in contact with the insulating layer 24.1. It is adapted to ensure a protection of the readout substrate 20 against a chemical attack, for example in an HF (hydrofluoric acid) acidic medium, implemented to etch the sacrificial mineral layer(s) used during making of the detection device 1. Thus, this protection thin layer 24.2 forms a hermetic and chemically-inert layer ensuring a protection of the underlying inter-metal dielectric layers 22.5 against the chemical attack, and is electrically-insulating to avoid any short-circuit. It may be made of alumina $Al_2O_3$, and possibly of aluminum nitride or fluoride, and may have a thickness comprised between a few tens and a few hundred nanometers, for example comprised between 10 nm and 500 nm.

The reflector 24.3 is adapted to reflect the light radiation to be detected in the direction of the absorbing membrane 11. It is located beneath the latter in the plane XY and forms a quarter-wave interferential optical cavity with the latter, allowing maximizing the absorption of the light radiation by the absorbing membrane 11. In this example, the reflector 24.3 is over and in contact with the protective thin layer 24.3, but it is possible to make it in contact with the insulating layer 24.1 and to cover it with the protective thin layer 24.2. It may be made of at least one silicon layer with a thickness of a few hundred nanometers, highly doped with a doping level at least equal to $10^{19}$ $cm^{-3}$.

The thermal detector 10 includes an absorbing membrane 11, suspended above the readout substrate 20 by thermally-insulating arms 12 and anchor pillars 13. The absorbing membrane 11 includes the thermometric transducer 11.1, herein a thermistor. The thermally-insulating arms 12 and the anchor pillars 13 are electrically-conductive and ensure electrical connection of the thermistor 11.1 to the readout circuit. The absorbing membrane 11 and the thermal insulation arms 12 are elements known to a person skilled in the art. In this example, the arms 12 and herein the absorbing membrane 11 are formed of a stack of a lower insulating layer 12.1, a conductive layer 12.2, and an upper insulating layer 12.3. The conductive layer 12.2 extends horizontally, in the plane XY, until coming into contact with the thermistor 11.1 to ensure the electrical polarization of the latter. Moreover, the absorbing membrane 11 includes an absorbing layer 11.2 (to absorb the light radiation to be detected), located above the thermistor 11.1 and resting on an intermediate insulating layer. The absorbing layer 11.2 is covered with the upper insulating layer 12.3. It may be made of TiN with a thickness of about 8 nm to 15 nm so as to obtain a layer resistance of about 377 Ω/square.

The anchor pillars 13 may be made based on an envelope for example made of Ti/TiN or Ta/TaN, and a core for example made of Cu and/or W. They extend vertically, according to the Z axis, up to the thermal insulation arms 12, and each comes into contact with a conductive portion 22.1 of the upper metallization level. Also, they cross the protective thin layer 24.2, the insulating layer 24.1, as well as the insulating layers 23.4 and 23.3 of the readout structure 23. Thus, they continuously extend according to the Z axis so as to come into contact with the conductive portions 22.1 of the upper metallization level. By "continuously extend", it should herein be understood that there is a continuity in the material of the anchor pillars 13 between the arms 13 and the conductive portions 22.1. In particular, they do not come into contact with conductive portions that would be located above the upper metallization level. Thus, each anchor pillar 13 has a lower portion which is surrounded by the dielectric material of the insulating layers of the readout substrate 20 (herein 24.2, 24.1, 23.4 and 23.3). In addition, at least one amongst the anchor pillars 13 comes into contact with the first conductive portion 22.1*a* of the upper metallization level to which the first active electronic element 23.1*a* is directly connected.

Thus, thanks the arrangement of the readout structure 23 over the interconnection structure 22, and thanks to the fact that the anchor pillars 13 continuously extend until coming into contact with the conductive portions 22.1 of the upper metallization level, it is possible to connect, for each sensitive pixel, at least one active electronic element 23.1 directly to the conductive portions 22.1 of the upper metallization level, and in particular to one of them (22.1*a*) with which one of the anchoring pillars 13 is in contact. Thus, the mechanical strength of the anchor pillars 13 is improved, but also the access resistance as well as the parasitic capacitances are reduced. The electrical performances of the detection device 1 are thereby improved, for example in terms of pulse response, readout speed. Moreover, as detailed later on, this configuration allows implementing methods for manufacturing the detection device 1 in a simple manner, these differing in particular by the fact that the transducer 11.1 withstands, or not, the high temperatures (around 1000° C.) of making of the active electronic elements 23.1. In the example of FIG. 1A, the transducer 11.1 is a thermistor which does not withstand these high temperatures.

Figure 1B:
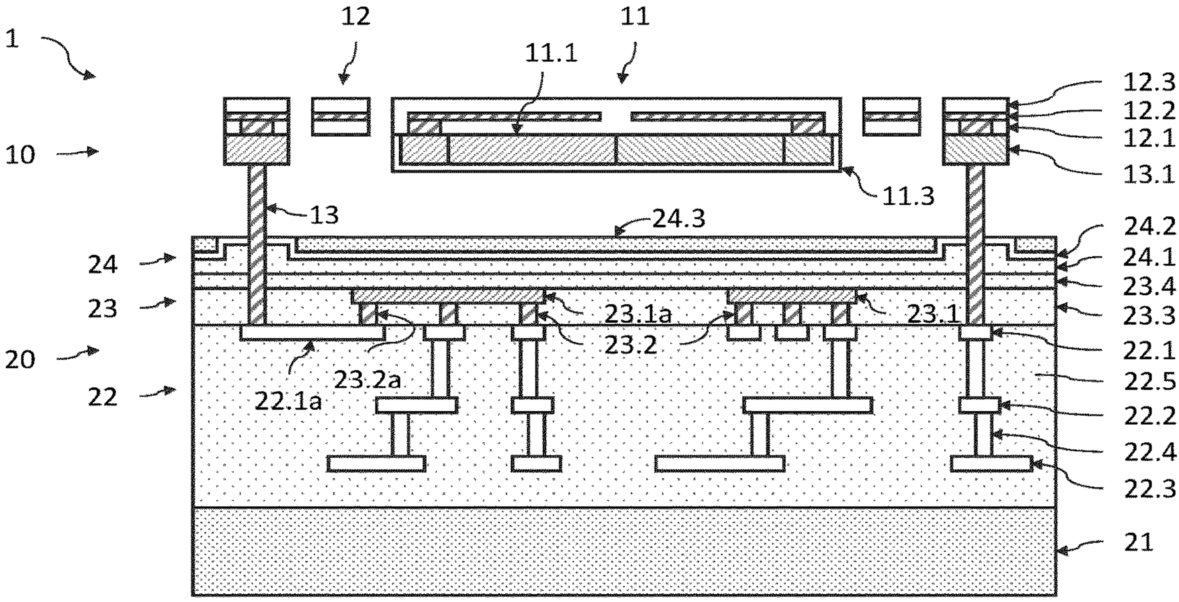
FIG. 1B is a schematic and partial cross-sectional view of a detection device according to one variant.

FIG. 1B is a schematic and partial cross-sectional view of a detection device 1 according to one embodiment. In this example, the transducer 11.1 is a diode (which withstands high temperatures, in the range of 1000° C., necessary for making the active electronic elements 23.1). The diode 11.1 is formed starting from a semiconductor layer and has p-type and n-type doped portions, so as to form, at the absorbing membrane 11, a pn semiconductor junction. The diode 11.1 is herein made based on silicon, preferably monocrystalline. The absorbing membrane 11 includes a lower insulating layer 11.3 (passivation), on which the diode 11.1 rests and is in contact. A stack of an insulating layer 12.1, a conductive layer 12.2, and an upper insulating layer 12.3 rests on the diode 11.1. At the absorbing membrane 11, the conductive layer 12.2 comes into contact with the p- and n-type doped portions of the diode 11.1 and ensures electrical polarization thereof. It herein extends above the diode 11 and forms a layer absorbing the light radiation to be detected.

FIGS. 2A to 2H illustrate different steps of a method for manufacturing a detection device 1 identical or similar to that of FIG. 1A. In this example, the reflector 24.3 is made of a material that withstands the high temperatures of making of the active electronic elements 23.1 and is therefore herein made before these. On the other hand, the thermistor 11.1 does not withstand these high temperatures, and is therefore made after the active electronic elements 23.1.

Figure 2A:
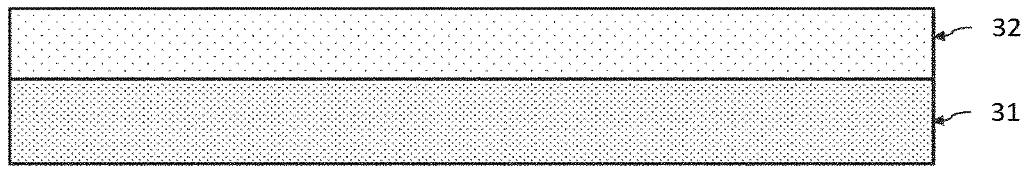
FIGS. 2A to 2H illustrate different steps of a method for manufacturing a detection device identical or similar to that of FIG. 1A.

Referring to FIG. 2A, a sacrificial layer 32, made of a mineral material such as an oxide or a silicon nitride, is deposited over a handle 31. The sacrificial layer 32 is intended to enable the subsequent making of the absorbing membrane 11. Its thickness will define the distance of the quarter-wave optical cavity between the absorbing membrane 11 and the reflector 24.3.

Figure 2B:
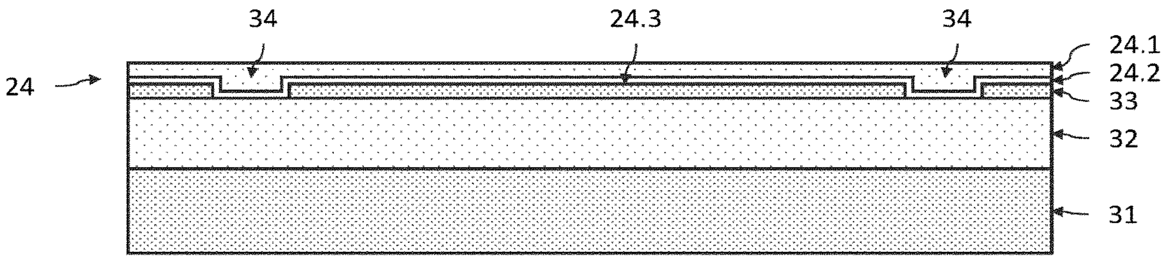

Referring to FIG. 2B, the reflector 24.3 is made afterwards then the protective thin layer 24.2. For this purpose, a continuous overdoped silicon layer 33 is deposited over and in contact with the sacrificial layer 32. Then, the reflector 24.3 is made by lithography and localized etching of the silicon layer 33. Openings 34 are formed in the silicon layer 33 so as to subsequently enable making of the anchor pillars 13. Then, the protective thin layer 24.2 is conformally deposited, so as to continuously cover the reflector 24.3 and descend into the openings 34 so as to come into contact with the sacrificial layer 32. Finally, the insulating layer 24.1, made of an oxide, is deposited so as to cover the protective thin layer. Afterwards, a planarization is performed. This stacking of the reflector 24.3, of the protective thin layer 24.2 and of the insulating layer 24.1 forms the upper structure 24 of the readout substrate 20.

Figure 2C:
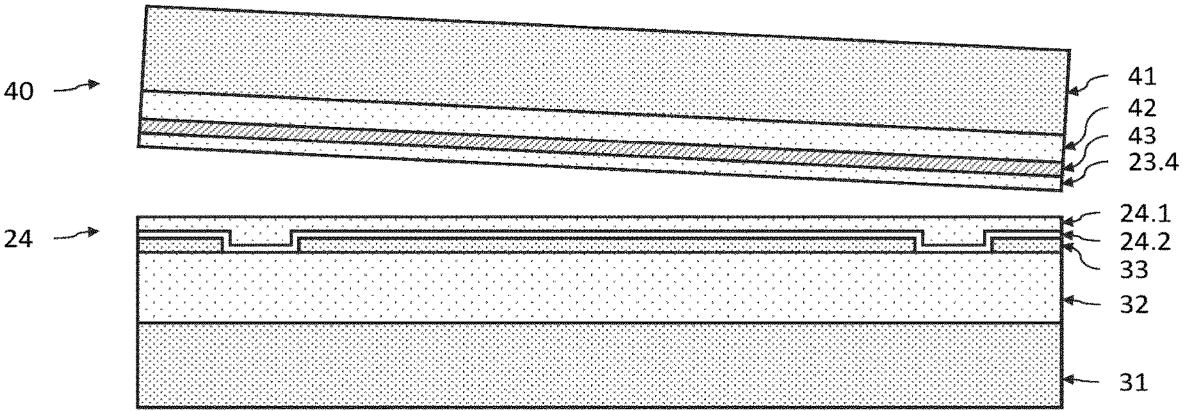

Referring to FIG. 2C, bonding of the SOI substrate 40 (a silicon substrate 41, a buried oxide layer 42, then a silicon thin layer 43 preferably monocrystalline) onto the insulating layer 24.1 is ensured. Bonding herein consists of an oxide/oxide molecular bonding. For this purpose, an insulating layer 23.4, made of an oxide, is deposited beforehand over the silicon thin layer 43. The insulating layers 23.4 and 24.1 are then brought into contact so as to ensure molecular bonding.

Figure 2D:
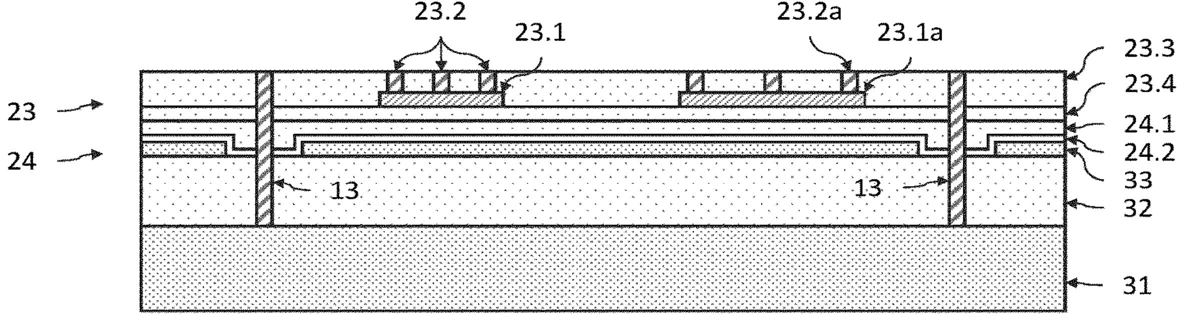

Referring to FIG. 2D, the removal of the silicon substrate 41 is performed (the buried oxide layer 42 may be kept at least partially), then the active electronic elements 23.1 and 23.1*a* are made (lithography, etching, deposition, doping, etc.). During these steps, a high temperature may be applied, in the range of 1000° C. However, the reflector 24.3 is herein made of a material withstanding these high temperatures. Afterwards, an insulating layer 23.3 made of a dielectric material, herein made of an oxide, is deposited so as to cover the active electronic elements 23.1, 23.1*a*. Then, the anchor pillars 13 as well as the conductive vias 23.2 are made. Preferably, they are then made in the same materials. The anchor pillars 13 herein continuously extend, i.e. with continuity of the materials forming them, from the upper face of the insulating layer 23.3 up to the handle 31. Hence, they cross the insulating layer 23.3, the insulating layer 23.4, the insulating layer 24.1, the protective thin layer 24.2, and finally the sacrificial layer 32. The conductive vias 23.2 cross the insulating layer 23.3 and come into contact with the active electronic elements 23.1, 23.1*a*. Afterwards, a planarization is carried out.

Figure 2E:
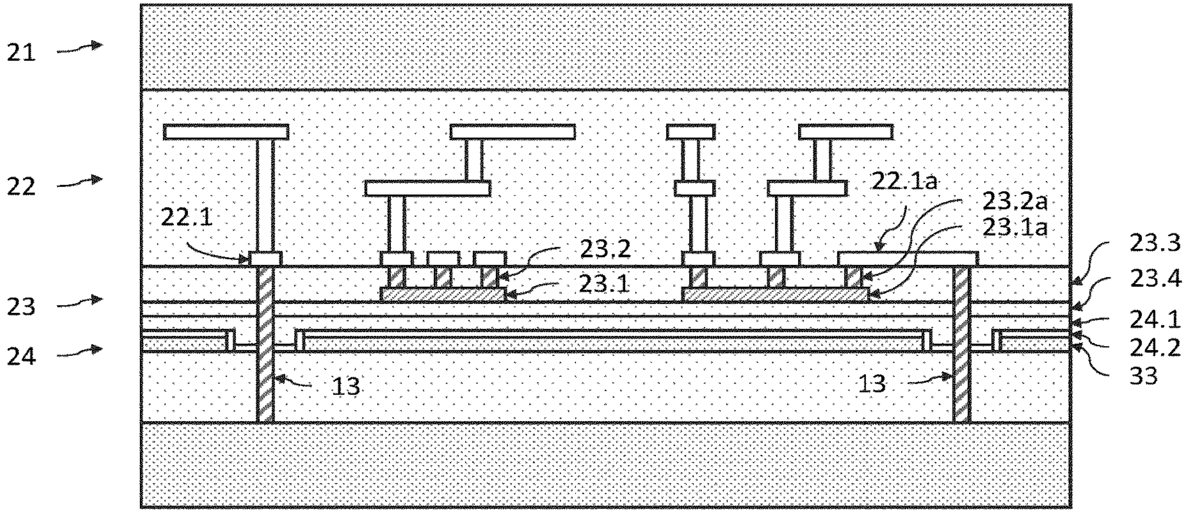

Referring to FIG. 2E, the interconnection structure 22 is made afterwards, starting with what will become the upper metallization level, then the intermediate metallization levels, and finally the lower metallization level. In particular, the conductive portions 22.1 of the upper metallization level are in contact with the conductive vias 23.2 of the active electronic elements 23.1. Thus, these are directly connected to the upper metallization level. In addition, the same conductive portion 22.1*a* of the upper metallization level is in contact with an anchor pillar 13 and with a conductive via 23.2*a* which ensures connection with the active electronic element 23.1*a*, herein an injection MOS transistor. Finally, a support substrate 21 is assembled to the interconnection structure 22.

Figure 2F:
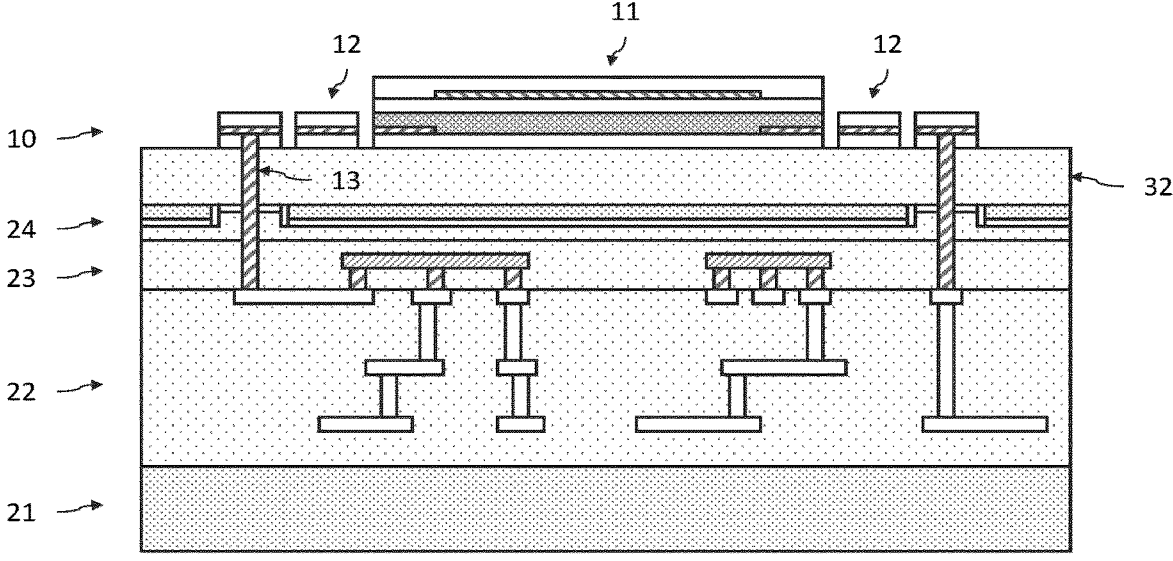

Referring to FIG. 2F, the completed stack is turned over, and the handle 31 is removed, so as to clear a face of the sacrificial layer 32. Afterwards, the thermal insulation arms 12 and the absorbing membrane 11 are made over the sacrificial layer 32. The thermal insulation arms 12 are in contact with one end of the anchor pillars 13 which have been made beforehand.

Figure 2G:
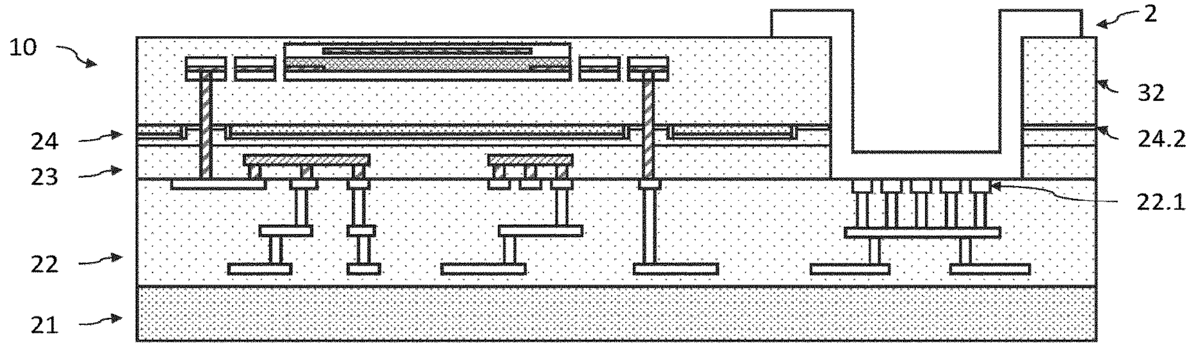

Referring to FIG. 2G, the outer connection pad 2 is made throughout the sacrificial layer 32, so as to come into contact with at least one conductive portion 22.1 of the upper metallization level. The outer connection pad 2 is made at least at one metallic layer, deposited in an indentation formed throughout the sacrificial layer 32, the protective thin layer 24.2, and the underlying insulating layers.

Figure 2H:
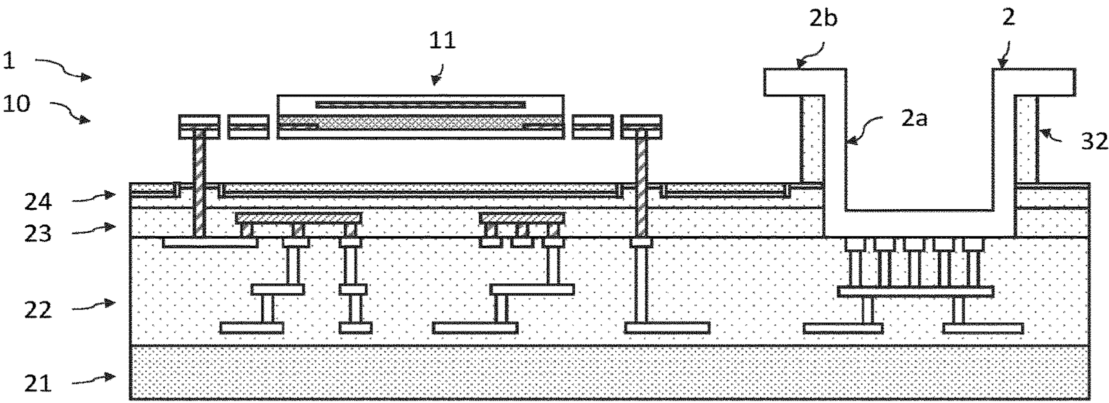

Referring to FIG. 2H, the absorbing membrane 11 is cleared by eliminating the sacrificial layer 32, herein by chemical attack with HF in a vapor phase. The outer connection pad 2 may include a peripheral upper portion 2*b* which extend laterally preferably over at least 5 μm starting from the vertical portion 2*a*. Thus, during the attack with vapor HF, a non-etched portion of the sacrificial layer 32 may be located beneath the peripheral upper portion 2*b*, which allows enhancing the mechanical strength of the outer connection pad 2.

Thus, the manufacturing method allows making a detection device 1 whose electrical performances, as well as the mechanical strength of the anchor pillars 13 are improved. In this method, the thermistor 11.1 is sensitive to the high temperatures generated during making of the active electronic elements 23.1, which explains why it is made after these.

FIGS. 3A to 3I illustrate different steps of a method for manufacturing a detection device 1 identical or similar to that of FIG. 1B. This method differs from that of FIG. 2A to 2H essentially in that the thermometric transducer 11.1 is a pn junction diode made before the readout structure 23. Several steps are identical or similar to those of the method of FIG. 2A to 2H and are therefore briefly described.

Figure 3A:
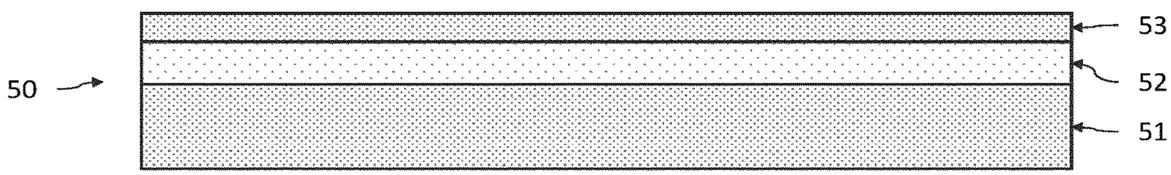
FIGS. 3A to 3I illustrate different steps of a method for manufacturing a detection device identical or similar to that of FIG. 1B.

Referring to FIG. 3A, a SOI substrate 50 is provided, formed of a silicon substrate 51, a buried oxide layer 52, then a silicon thin layer 53 preferably monocrystalline.

Figure 3B:
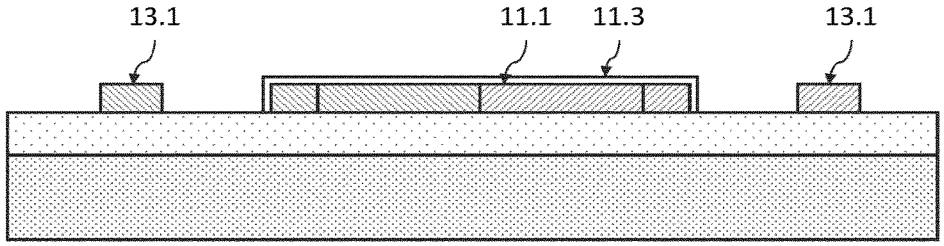

Referring to FIG. 3B, the thermometric transducer 11.1*n* herein a pn junction diode, is made starting from the silicon thin layer 53. For this purpose, the silicon thin layer 53 is structured by lithography and localized etching, and the p-type and n-type doped portions are made by localized ion implantation. Lateral semiconductor pads 13.1, derived from the silicon thin layer 53 and preferably doped, may be made and are intended to be located at the head of anchor pillars 13. Moreover, a passivation thin layer 11.3 may be deposited so as to cover only the transducer 11.1.

Figure 3C:
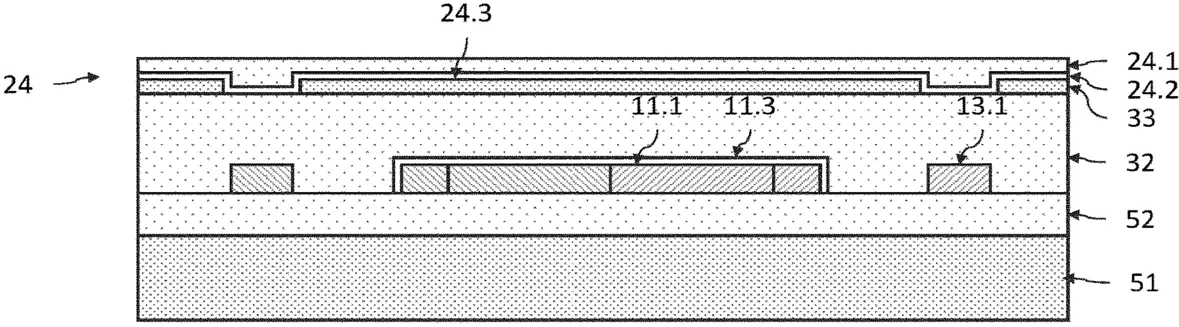

Referring to FIG. 3C, a sacrificial layer 32 made of a mineral material, for example of a silicon oxide, is deposited so as to cover the transducer 11.1, the lateral semiconductor pads 13.1, and the buried oxide layer 52. This sacrificial layer 32 has a thickness which will define the dimension of the quarter-wave optical cavity between the absorbing membrane 11 and the reflector 24.3. Afterwards, the reflector 24.3, then the protective thin layer 24.2, and finally the insulating layer 24.1, are made in a manner identical or similar to what has been described with reference to FIG. 2B.

Figure 3D:
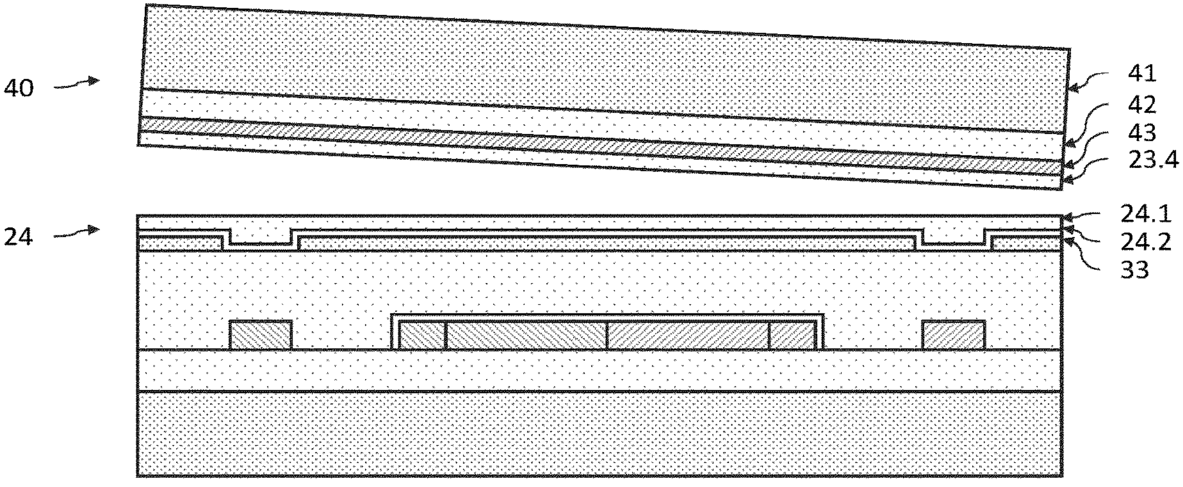

Referring to FIG. 3D, a SOI substrate 40 (a silicon substrate 41, a buried oxide layer 42, a silicon thin layer 43 preferably monocrystalline), covered with the insulating layer 23.4 made of an oxide, is transferred and bonded to the insulating layer 24.1. Bonding herein consists of an oxide/oxide molecular bonding.

Figure 3E:
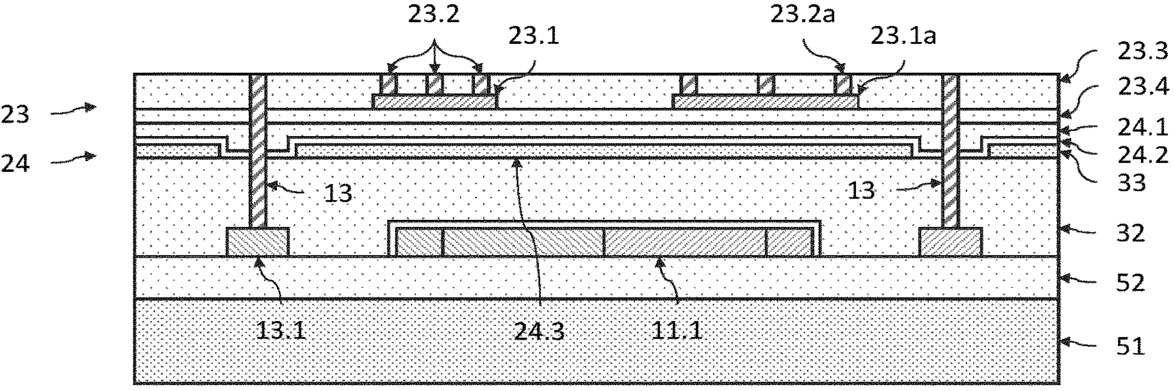

Referring to FIG. 3E, the substrate 41 is removed. Then, the readout structure 23 and its active electronic elements 23.1, 23.1*a* are made. During these steps, the stack may be subjected to high temperatures, in the range of 1000° C., which nonetheless does not alter the properties of the transducer 11.1 or those of the reflector 24.3.

Finally, the anchor pillars 13 and the conductive vias 23.2 are made. The anchor pillars 13 continuously extend from the upper face of the insulating layer 23.3 up to the silicon substrate 51. Hence, they cross the insulating layer 23.3, the insulating layer 23.4, the insulating layer 24.1, the protective thin layer 24.2, and finally the sacrificial layer 32, to come into contact with the lateral semiconductor pads 13.1. The conductive vias 23.2 cross the insulating layer 23.3 and come into contact with the active electronic elements 23.1, 23.1*a*. Afterwards, a planarization is carried out.

Figure 3F:
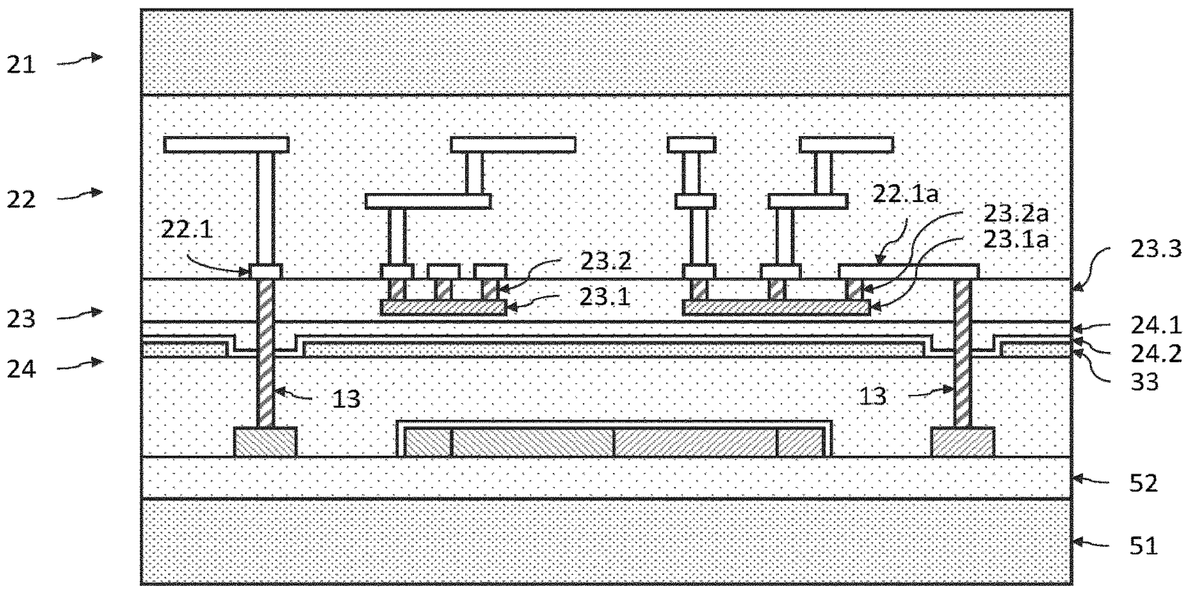

Referring to FIG. 3F, the interconnection structure 22 is made, starting with whare will be become the upper metallization level, then the intermediate metallization levels, and finally the lower metallization level. The conductive portions 22.1 of the upper metallization level are in contact with the conductive vias 23.2 of the active electronic elements 23.1. In addition, the same conductive portion 22.1*a* of the upper metallization level is in contact with an anchor pillar 13 and the conductive via 23.2*a* which ensures connection with the active electronic element 23.1*a* (for example, a MOS transistor whose function depends on the readout type, by charge transfer or under voltage. Readout by charge transfer: the MOS is used to transfer the charges (transfert gate). Readout under voltage: the MOS is used to amplify the electrical voltage (source follower). Finally, a support substrate 21 is assembled to the interconnection structure 22.

Figure 3G:
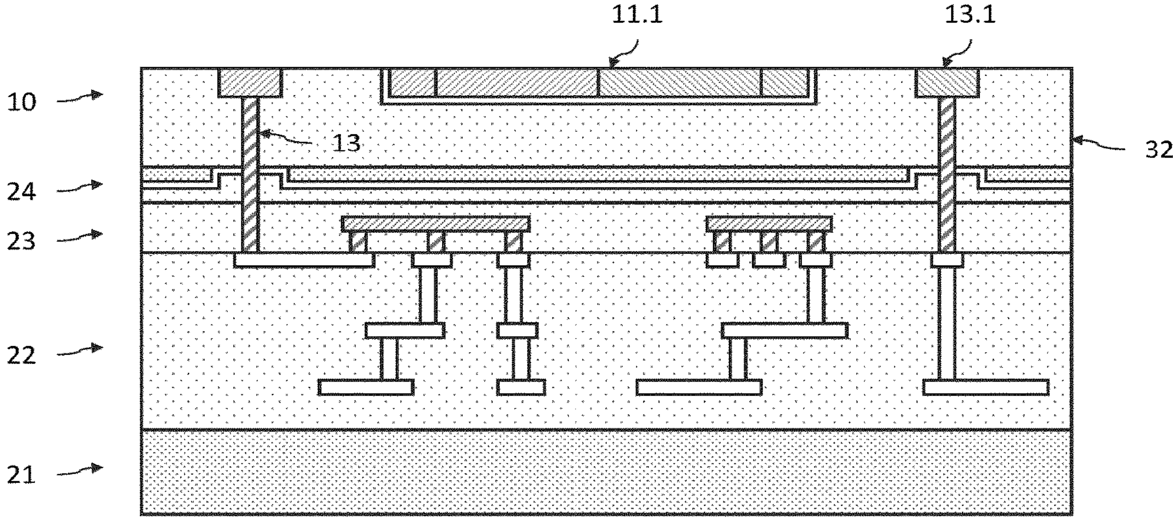

Referring to FIG. 3G, the completed stack is turned over, and the handle 51 and then the buried oxide layer 52 are removed. Thus, an upper face of the transducer 11.1, herein as well as that of the lateral semiconductor pads 13.1, are cleared.

Figure 3H:
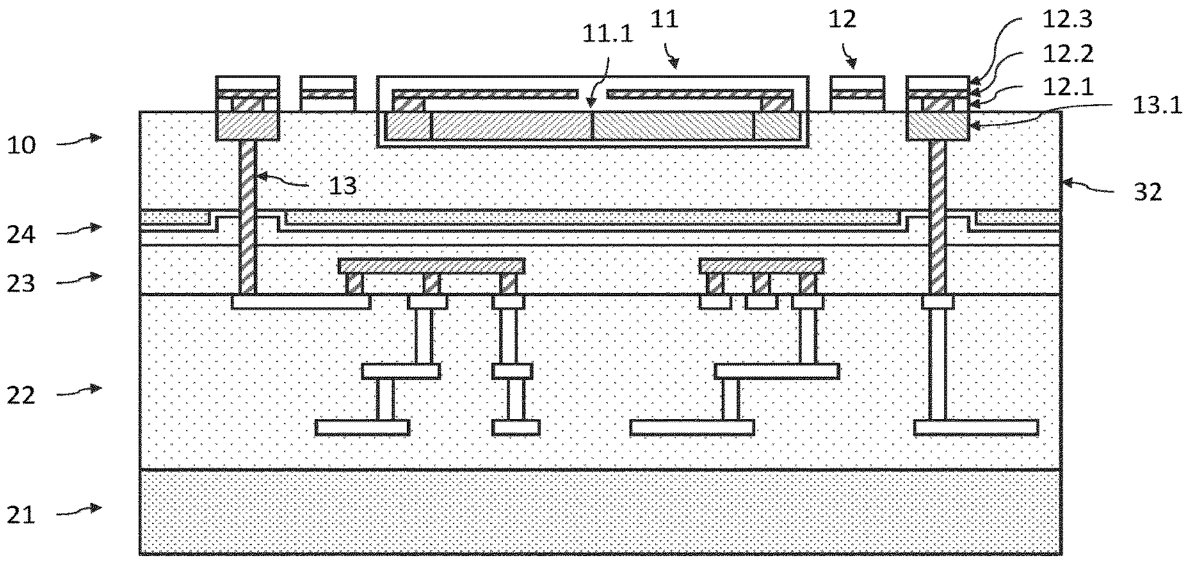

Referring to FIG. 3H, the thermal insulation arms 12 are made and making of the absorbing membrane 11 is completed. Thus, the insulating layer 12.1, the conductive layer 12.2, and the insulating layer 12.3 are deposited. The conductive layer 12.2 comes into contact with the lateral semiconductor pads 13.1, as well as p-type and n-type doped portions of the diode 11.1. Moreover, the outer connection pad (not shown) is also made, as described before.

Figure 3I:
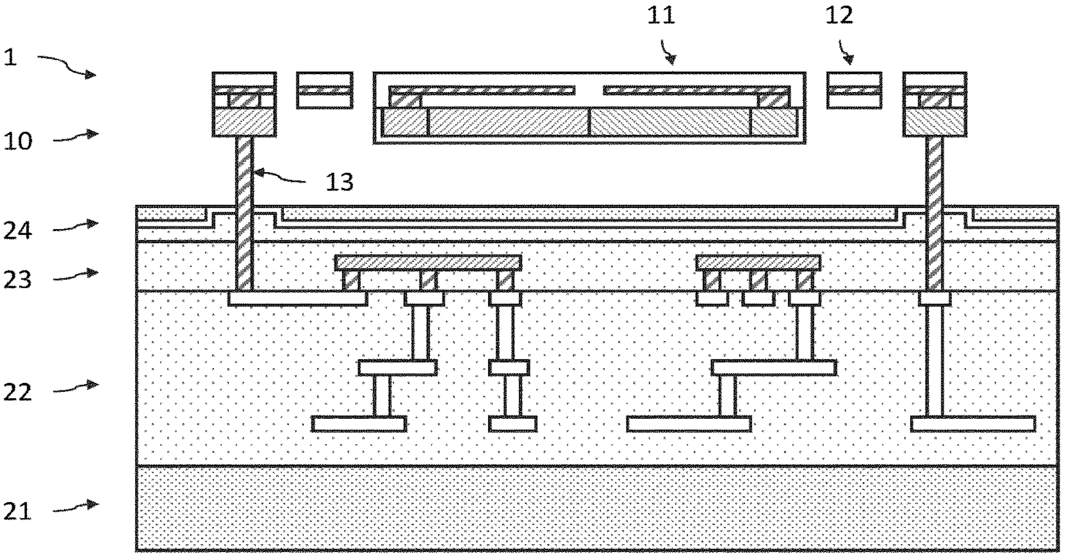

Referring to FIG. 3I, the absorbing membrane 11 is cleared by eliminating the sacrificial layer, herein by attack with vapor HF.

Thus, the method allows manufacturing a detection device 1 having improved electrical performances while increasing the mechanical strength of the anchor pillars 13 of the thermal detectors 10. In this example, the transducers 11.1 of the thermal detectors 10 are made before the active electronic elements 23.1 to the extent that they can withstand the high temperatures applied when making these.

Figure 4A:
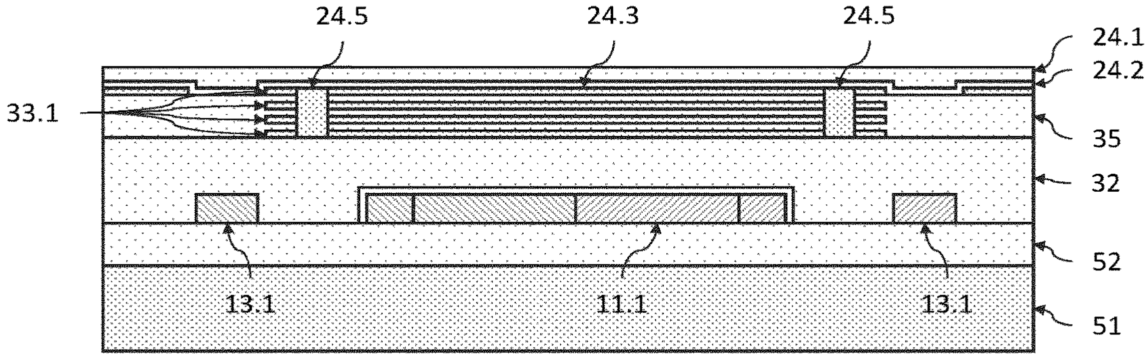
FIGS. 4A and 4B illustrate different steps of a method for manufacturing a detection device similar to that of FIG. 1B, where the reflector is a Bragg mirror.
Figure 4B:
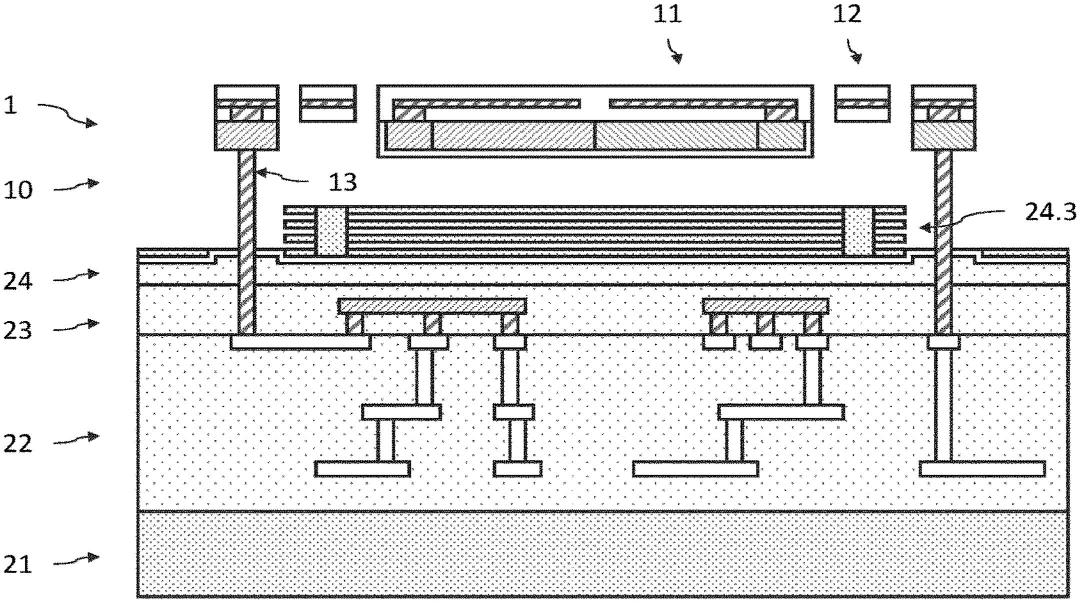

FIGS. 4A and 4B illustrate different steps of a method for manufacturing a detection device 1 according to another embodiment. In this example, each thermal detector 10 includes a reflector 24.3 such as a Bragg mirror. The Bragg mirror is then formed of a series of thin layers made of a material with a high refractive index (herein made of silicon), distinct and spaced vertically apart from one another. It may include at least two thin layers with a high index. In this example, the thermometric transducer is a junction diode, but it could be a thermistor, a transistor, etc.

Referring to FIG. 4A, we herein start from a stack similar to that of FIG. 3B. The transducer 11.1 (pn junction diode) and the lateral semiconductor pads 13.1 are made over the buried oxide layer 52. They are covered with the sacrificial layer 32. Afterwards, a multilayer is made formed of a stack of thin layers 33.1 made of a material with a high index, herein silicon, spaced apart in pairs by a sacrificial layer 35 made of a mineral material, herein a silicon oxide. Afterwards, the multilayer is structured by lithography and localized etching. Lateral vias 24.5, herein made of silicon, are made at the lateral ends of the multilayer. They cross the silicon thin layers 33.1 and are intended to ensure holding thereof once the sacrificial layer 35 has been eliminated. Finally, the protective thin layer 24.2 is deposited so as to cover the whole, and the insulating layer 24.1 is deposited over the protective thin layer 24.2 and then planarized.

Referring to FIG. 4B, afterwards, it is proceeded with transferring and molecular bonding of the SOI substrate 40 (cf. FIG. 3D), making of the readout structure 23 (FIG. 3E), then that of the interconnection structure 22 (FIG. 3F), then making of the thermal insulation arms 12 and the completion of the absorbing membrane 11 (FIGS. 3G and 3H), and finally the suspension of the absorbing membrane 11 by elimination of the sacrificial layers 32 and 35. Thus, the reflector 24.3 is a Bragg mirror formed of an alternation of Si/void layers. The silicon thin layers 33.1 are held suspended by means of the lateral vias 24.5.

FIGS. 5A to 5D illustrate different steps of a method for manufacturing a detection device 1 according to another embodiment. In this example, the detection device 1 includes a second readout substrate 60, assembled to the first readout substrate 20 at the rear face and electrically connected to the latter.

Figure 5A:
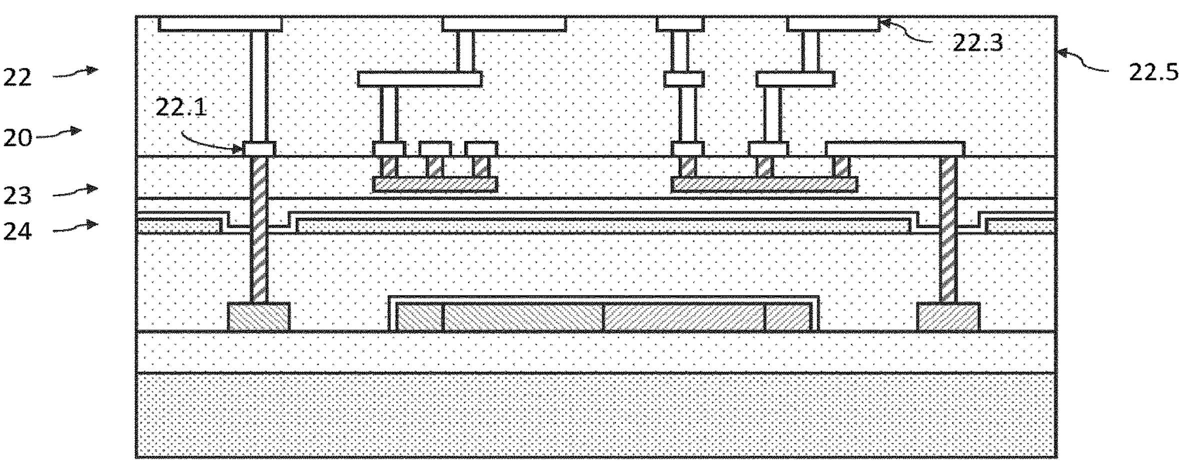
FIGS. 5A to 5D illustrate different steps of a method for manufacturing a detection device similar to that of FIG. 1B, where a second readout substrate is assembled and connected at the rear face to the first readout substrate.

Referring to FIG. 5A, starting from a set identical or similar to those of FIG. 2G or 3F, except that, after making of the interconnection structure 22, the conductive portions 22.3 of the last metallization level (lower level) are flush with one face of the stack. Hence, they are not covered by a last insulating layer, and the support layer 21 of FIGS. 2G and 3F is not assembled to the stack.

Figure 5B:
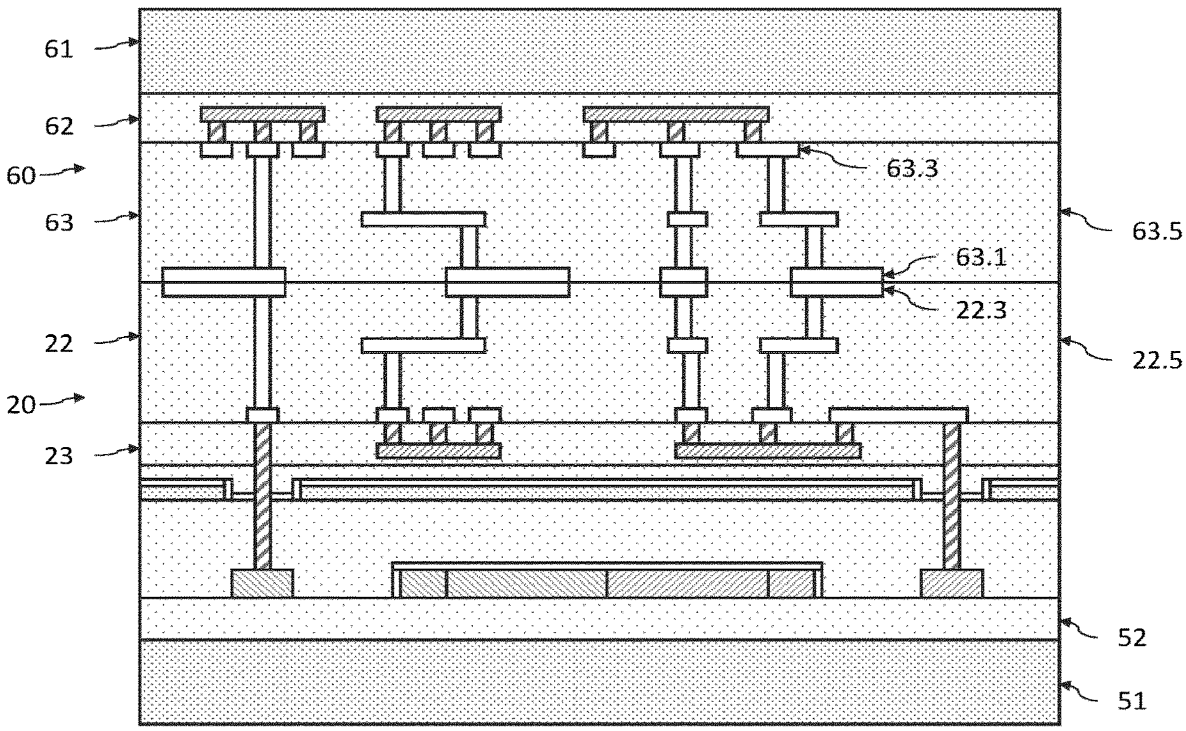

Referring to FIG. 5B, a second readout substrate 60 is transferred and assembled by molecular bonding to the free face of the interconnection structure 22. The second readout substrate 60 is formed of a stack of a support substrate 61, then a readout structure 62, and finally an interconnection structure 63. The conductive portions 63.1 of the upper metallization level of the interconnection structure 63 are flush with the free face of the readout substrate 60. Thus, they are brought into contact with the conductive portions 22.3, and an oxide/oxide and metal/metal hybrid molecular bonding is carried out.

Figure 5C:
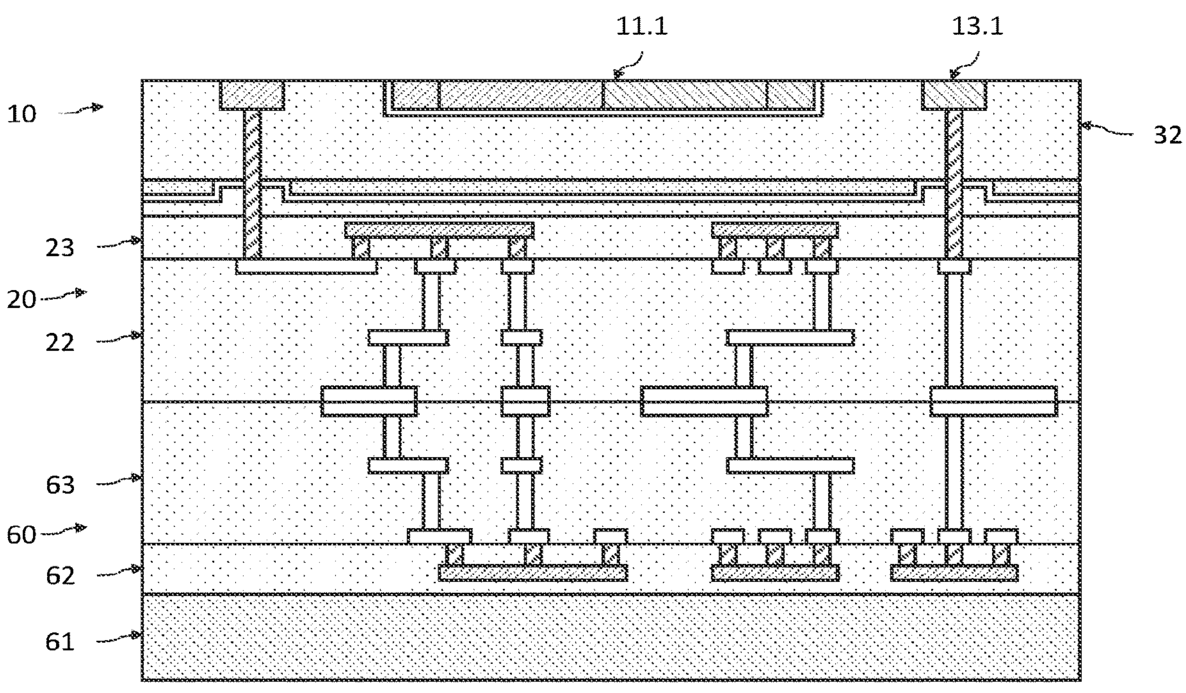

Referring to FIG. 5C, the set is turned over, the substrate 51 as well as the buried oxide layer 52 are removed, so as to clear an upper face of the transducer 11.1 and lateral semiconductor pads 13.1.

Figure 5D:
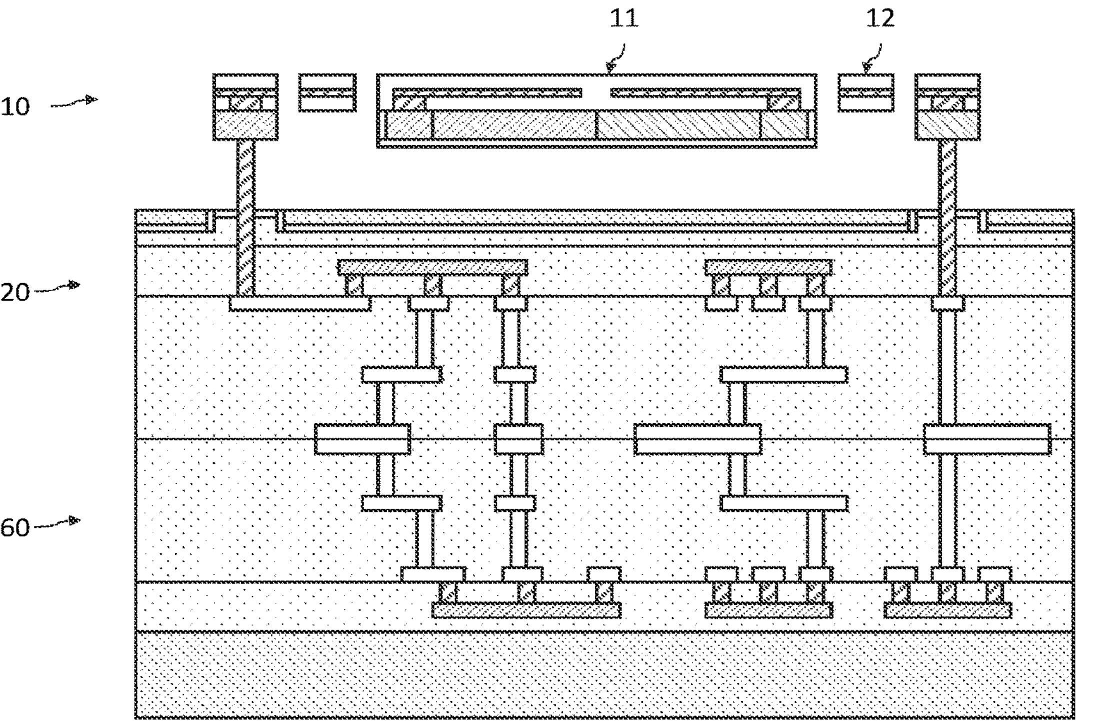

Referring to FIG. 5D, making of the thermal detector 10 is completed, by making the thermal insulation arms 12, the absorbing membrane 11 and the outer connection pad (not shown). Afterwards, the absorbing membrane 11 is suspended by elimination of the sacrificial layer 32.

Thus, a detection device 1 is obtained including two readout substrate, 20 and 60, stacked and electrically connected to one another, where the two interconnection structures 22 and 63 are in contact with one another. This is made possible by the inverted configuration of the interconnection 22 and readout 23 structures in the readout substrate 20.

Particular embodiments have just been described. Different variants and modifications will appear to a person skilled in the art.

The invention claimed is:

1. A device for detecting an electromagnetic radiation, comprising at least one sensitive pixel including a thermal detector, and including:

- a readout substrate, including a readout circuit, which is formed of a stack of:
  - a readout structure containing active electronic elements of the readout circuit,
    - including at least one first active electronic element located in the sensitive pixel and connected to the thermal detector;
  - an interconnection structure containing different metallization levels connected to the active electronic elements,
    - including an upper metallization level located on a side of an upper face of the readout substrate;
- the thermal detector, including:
  - an absorbing membrane, suspended above an upper face of the readout substrate and thermally insulated from the readout substrate;
  - anchor pillars, ensuring suspension of the absorbing membrane and the electrical connection of the absorbing membrane to the readout circuit;
- wherein:
  - the readout structure is located over and in contact with the interconnection structure;
  - the first active electronic element is directly connected to the upper metallization level;
  - the anchor pillars continuously extend in the readout substrate (20) until coming into contact with the upper metallization level;
- the readout substrate including:
  - an upper structure located over and in contact with the readout structure,
- the readout structure including:
  - a first insulating layer in which the active electronic elements are located and throughout which conductive vias extend between the active electronic elements and conductive portions of the upper metallization level;
  - a second insulating layer which extends over and in contact with the insulating layer and the active electronic elements;
- the upper structure including:
  - a third insulating layer, which extends over and in contact with the second insulating layer;
  - a reflector resting on the third insulating layer.

2. The detection device according to claim 1, wherein the upper metallization level includes several coplanar conductive portions, including a first conductive portion with which a first anchor pillar of the sensitive pixel comes into contact, and to which the first active electronic element is connected by means of a first conductive via.

3. The detection device according to claim 1, wherein the active electronic elements are directly connected to coplanar conductive portions of the upper metallization level through conductive vias, said conductive vias and the anchor pillars being made of the same materials.

4. The detection device according to claim 1, wherein the upper structure includes a protective thin layer, made of a material inert to hydrofluoric acid, extending over the third insulating layer, the first, second and third insulating layers being made of a mineral material.

5. The detection device according to claim 1, wherein the reflector is a Bragg mirror formed of several thin layers spaced vertically apart from one another and held by conductive vias crossing said thin layers.

6. The detection device according to claim 1, wherein the readout substrate is a first readout substrate to which a second readout substrate is assembled and electrically connected at the level of a face opposite to the upper face of the first readout substrate, the second readout substrate including a stack of a second readout structure and of a second interconnection structure, wherein:

- conductive portions of a lower metallization level of the second interconnection structure are connected to active electronic elements of the second readout structure;
- conductive portions of an upper metallization level of the second interconnection structure are in contact with conductive portions of a lower metallization level of the interconnection structure of the first readout substrate.

7. The detection device according to claim 1, including an outer connection pad intended to be electrically connected to an outer electronic system, extending throughout the readout structure so as to come into contact with at least one conductive portion of the upper metallization level.

8. A method for manufacturing a detection device according to claim 1, including the following steps:

- making a first stack including a handle on which a sacrificial layer made of a mineral material rests;
- transferring and molecular bonding, onto the first stack, of a SOI substrate formed of a silicon substrate, an oxide layer then a silicon thin layer, then removal of the silicon substrate;
- making the readout structure, the active electronic elements being made starting from the silicon thin layer over the SOI substrate,
- making the interconnection structure over the readout structure, conductive portions of the upper metallization level being directly connected to the active electronic elements through conductive vias;
- turning obtained stack over, then removing the handle;
- making the absorbing membrane over the sacrificial layer;
- eliminating the sacrificial layer so as to suspend the absorbing membrane.

9. The manufacturing method according to claim 8, wherein making of the readout structure includes the following steps:

depositing a first insulating layer covering the active electronic elements;

making conductive vias, extending throughout the first insulating layer so as to come into contact with the active electronic elements;

making the anchor pillars, extending throughout the first insulating layer and the sacrificial layer so as to come into contact with the handle.

10. The manufacturing method according to claim 8, including, before the transferring and molecular bonding step, a step of making an upper structure, resting on the sacrificial layer, including a reflector and a protective thin layer, which are covered with a third insulating layer.

11. The manufacturing method according to claim 10, wherein, the silicon thin layer of the SOI substrate is covered with a second insulating layer, so that, during transferring and molecular bonding, the second insulating layer is brought into contact with the third insulating layer.

12. The manufacturing method according to claim 8, wherein, during the step of making the absorbing membrane, a thermometric transducer, comprising a thermistor, is made.

13. The manufacturing method according to claim 8, wherein, during the step of making the first stack, a thermometric transducer, comprising a junction diode or a transistor, is made over the handle, then is covered with the sacrificial layer.

* * * * *